United States Patent
Tsai et al.

(10) Patent No.: US 9,601,608 B2
(45) Date of Patent: Mar. 21, 2017

(54) STRUCTURE FOR A GALLIUM NITRIDE (GAN) HIGH ELECTRON MOBILITY TRANSISTOR

(71) Applicant: Taiwan Semiconductor Manufacturing Co., Ltd., Hsin-Chu (TW)

(72) Inventors: Ming-Wei Tsai, Zhudong Township (TW); King-Yuen Wong, Tuen Mun (HK); Han-Chin Chiu, Kaohsiung (TW); Sheng-de Liu, Zhongli (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/540,250

(22) Filed: Nov. 13, 2014

(65) Prior Publication Data

US 2016/0141404 A1   May 19, 2016

(51) Int. Cl.
  *H01L 29/66*  (2006.01)
  *H01L 29/778*  (2006.01)
  (Continued)

(52) U.S. Cl.
  CPC .... *H01L 29/7787* (2013.01); *H01L 29/66462* (2013.01); *H01L 29/1066* (2013.01); *H01L 29/2003* (2013.01); *H01L 29/41766* (2013.01)

(58) Field of Classification Search
  CPC . H01L 2224/13155; H01L 2224/13255; H01L 2224/13284; H01L 2224/13309;
  (Continued)

(56) References Cited

U.S. PATENT DOCUMENTS

| 7,238,560 B2 * | 7/2007 | Sheppard | H01L 29/7787 257/E21.407 |
| 8,198,178 B2 * | 6/2012 | Heikman | H01L 29/7787 257/E21.09 |

(Continued)

OTHER PUBLICATIONS

Sque, Stephen. "High-Voltage GaN-HEMT Devices, Simulation and Modelling." NXP Semiconductors, Sep. 16, 2013.
(Continued)

*Primary Examiner* — Tod T Van Roy
*Assistant Examiner* — Vu A Vu
(74) *Attorney, Agent, or Firm* — Eschweiler & Potashnik, LLC (57) ABSTRACT

A high-electron mobility transistor (HEMT) device employing a gate protection layer is provided. A substrate has a channel layer arranged over the substrate and has a barrier layer arranged over the channel layer. The channel and barrier layers define a heterojunction, and a gate structure is arranged over a gate region of the barrier layer. The gate structure includes a gate arranged over a cap, where the cap is disposed on the barrier layer. The gate protection layer is arranged along sidewalls of the cap and arranged below the gate between opposing surfaces of the gate and the cap. Advantageously, the gate protection layer passivates the gate, reduces leakage current along sidewalls of the cap, and improves device reliability and threshold voltage uniformity. A method for manufacturing the HEMT device is also provided.

20 Claims, 6 Drawing Sheets

(51) Int. Cl.
    *H01L 29/20*     (2006.01)
    *H01L 29/417*    (2006.01)
    *H01L 29/10*     (2006.01)

(58) Field of Classification Search
    CPC ... H01L 2224/13318; H01L 2224/1332; H01L 2224/13338
    USPC ........................................................ 257/194
    See application file for complete search history.

(56) References Cited

U.S. PATENT DOCUMENTS

| | | | |
|---|---|---|---|
| 8,669,592 B2 | 3/2014 | Miyajima et al. | |
| 2013/0075789 A1* | 3/2013 | Kanamura | H01L 29/42364 257/194 |
| 2013/0341679 A1* | 12/2013 | Green | H01L 29/402 257/192 |
| 2014/0191288 A1* | 7/2014 | Kotani | H01L 21/02112 257/194 |
| 2014/0209922 A1* | 7/2014 | Ota | H01L 29/42316 257/76 |
| 2014/0231816 A1 | 8/2014 | Chiu et al. | |

OTHER PUBLICATIONS

Hilt, et al. "Normally-Off AlGaN/GaN HFET with p-type GaN Gate and AlGaN Buffer." Proceedings of the 22nd International Symposium on Power Semiconductor Devices & ICs, Hiroshima, 2010.
Hwang, et al. "P-GaN Gate HEMTs With Tungsten Gate Metal for High Threshold Voltage and Low Gate Current." IEEE Electron Device Letters, vol. 34, No. 2, Feb. 2013.

* cited by examiner

STRUCTURE FOR A GALLIUM NITRIDE (GAN) HIGH ELECTRON MOBILITY TRANSISTOR

BACKGROUND

Semiconductor devices, such as transistors and photodiodes, based on silicon have been the standard for the past three decades. However, semiconductor devices based on alternative materials are receiving increasing attention for advantages over silicon-based semiconductor devices. Semiconductor devices based on gallium nitride (GaN) are one example of such semiconductor devices.

GaN-based semiconductor devices have found widespread use in optoelectric applications (e.g., in light emitting diodes) due to the wide band gap of GaN. GaN-based semiconductor devices also offer a potential advantage for use in solar cells (e.g., where GaN semiconductor devices cover a wide range of solar photons) and in high power applications (e.g., where the high electron mobility and low temperature coefficients of GaN allow it to carry large currents and support high voltages).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A typical gallium nitride (GaN) transistor includes a thin layer of aluminum gallium nitride (AlGaN) located above a GaN layer. Because the AlGaN and GaN layers exhibit different bandgaps, they are said to meet at a heterojunction. Under proper conditions, a two-dimensional electron gas (2-DEG) is formed at this heterojunction interface of the GaN and AlGaN layers. In the 2-DEG, some electrons are unbound to atoms and free to move. This provides for higher transistor mobility as compared with other types of transistors. Therefore, GaN transistors are often referred to as high-electron mobility transistor (HEMT) devices, although it will be appreciated that HEMTs can in general also be made of from other heterojunctions, such as, for example, GaAs/AlGaAs. To control the flow of carriers from a source to a drain, a gate structure can either be formed directly on top of the AlGaN layer (i.e., in direct contact with the top surface of the AlGaN layer) or recessed into the AlGaN layer (e.g., to improve the range of the drain source voltage).

One type of HEMT device is a GaN enhancement mode transistor, although depletion mode HEMT devices are also contemplated as falling within the scope of this disclosure. GaN enhancement mode transistors operate similar to silicon-based metal-oxide-semiconductor field-effect transistors (MOSFETS) by being normally in a non-conducting state (i.e., normally off). Further, GaN enhancement mode transistors are designed for a bias voltage and include a gate structure arranged over the AlGaN layer. The gate structure typically includes a p-type doped GaN cap with a high work function and a metal gate arranged on the p-GaN cap. The properties, such as thickness and material type, of the p-GaN cap are employed to achieve the bias voltage.

Challenges with typical GaN enhancement mode transistors stem from the sidewall trap level of the p-GaN cap. The sidewalls of the p-GaN cap trap a high concentration of electrons, which forms a current leakage path from the edge of the metal gate, along the sidewalls of the cap, to the channel region. Additional challenges with typical GaN enhancement mode transistors stem from damage to the p-GaN cap during the formation of the metal gate. The leakage current and the damage to the p-GaN cap affect the threshold voltage uniformity and the device reliability, as determined by, for example, the high temperature gas bias (HTGB) test and the high temperature reverse bias (HTRB) test. Known solutions to reduce the leakage current include the addition of a silicon nitride (SiN) passivation layer arranged exclusively along the cap sidewalls. However, such solutions still have a high sidewall trap level.

In view of the foregoing, the present disclosure is directed to an improved HEMT device having a gate protection layer to passivate the metal gate, to eliminate the current leakage path along the sidewalls of the p-GaN cap, to improve the threshold voltage uniformity, and to prevent damage to the p-GaN cap. The gate protection layer is arranged along sidewalls of the p-GaN cap and between the metal gate and the p-GaN cap. In some embodiments, the gate protection layer is also arranged along sidewalls and a bottom surface of the metal gate. The gate protection layer is typically a dielectric material, such as aluminum nitride (AlN) or aluminum oxide (AlO), but other materials are amenable. The present disclosure is also directed to an improved method for manufacturing the improved HEMT device.

Figure 1:
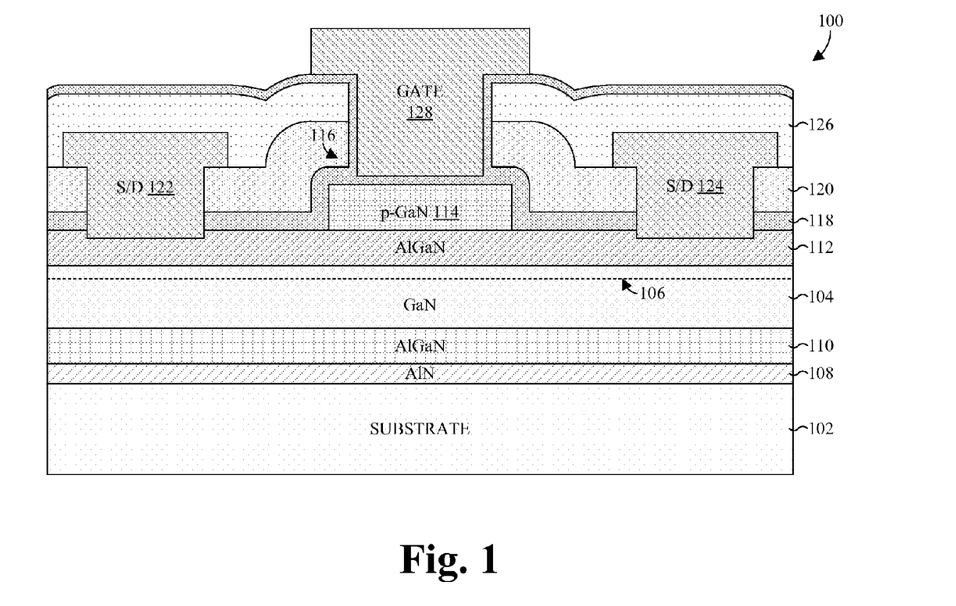
FIG. 1 illustrates a cross-sectional view of some embodiments of a high-electron mobility transistor (HEMT) device employing a gate protection layer.

With reference to FIG. 1, a cross-sectional view 100 of some embodiments of an HEMT device is provided. Typically, as illustrated, the HEMT device is a GaN enhancement mode transistor, which is normally off (i.e., off without application of a gate voltage). The HEMT device includes a substrate 102 over which a channel layer 104 is arranged. The substrate 102 is, for example, a silicon carbide substrate, a silicon substrate, or a sapphire substrate.

The channel layer 104 includes a channel region 106 (demarcated by the dashed line), within which a conductive channel is selectively formed. The channel layer 104 is or otherwise includes a semiconductor material, such as a group III-V semiconductor material. In some embodiments, where the HEMT device is a GaN enhancement mode transistor, the channel layer 104 is or otherwise includes GaN and/or is about 10 nanometers thick. In alternative embodiments, the channel layer 104 is or otherwise includes indium gallium nitride (InGaN), for example. The channel layer 104 is typically un-doped, but it can be can be doped intentionally or unintentionally (e.g., unintentionally from process contaminants). Further, where doped, the channel layer 104 is typically doped with an n-type dopant.

In some embodiments, one or more buffer layers 108, 110 are arranged between the substrate 102 and the channel layer 104. For example, a first buffer layer 108 of AlN is arranged on the substrate 102, and a second buffer layer 110 of AlGaN is arranged on the first buffer layer 108. The second buffer layer 110 includes, for example, 5% aluminum. The buffer layers 108, 110 have lattice constants that transition between a lattice constant of the substrate 102 and a lattice constant of the channel layer 104.

A barrier layer 112 is located directly on top of the channel layer 104, such that the top surface of the channel layer 104 and the bottom surface of the barrier layer 112 abut each other. The barrier layer 112 includes a material having a band gap unequal to (e.g., larger than) that of the channel layer 104. For example, the barrier layer 112 includes a thin film of AlGaN having a band gap that is larger than the band gap of the channel layer 104 having a thin film of GaN (AlGaN has a band gap of approximately 4 electron volts (eV), while GaN has a band gap of approximately 3.4 eV). In some embodiments, the barrier layer 112 is intentionally doped with n-type doping. Further, in some embodiments, the barrier layer 112 includes 23% aluminum and/or is about 15 nanometers thick.

The barrier layer 112 and the channel layer 104 collectively define a heterojunction at the interface of the channel layer 104 and the barrier layer 112. The heterojunction allows the barrier layer 112 to selectively provide or remove electrons to or from a 2-DEG in the channel region 106 along the interface between the channel layer 104 and the barrier layer 112. The 2-DEG has high mobility electrons that are not bound to any atoms and free to move within the 2-DEG. With a high concentration of electrons from the barrier layer 112, the 2-DEG serves as the conductive channel for the HEMT device.

A cap 114 of a gate structure 116 is located over a gate region of the barrier layer 112. In some embodiments, the cap 114 is arranged in direct contact with the barrier layer 112, such that the bottom surface of the cap 114 abuts the top surface of the barrier layer 112. The doping and material selected for the cap 114 partially sets the threshold voltage of the HEMT device (e.g., by raising the conduction band energy $E_C$ and reducing the conduction band to Fermi level energy). For example, dimensions and material properties can be adjusted to set the threshold voltage. Further, the cap 114 includes a group III-V semiconductor material with a high work function. In some embodiments, the group III-V semiconductor material includes GaN having a doping type. In alternative embodiments, the group III-V semiconductor material includes AlGaN or InGaN having the doping type. The doping type is, for example, a p-type doping, an n-type doping, or both a p-type and n-type doping.

A gate protection layer 118 and a passivation layer 120 are stacked in that order over and along top surfaces and sidewalls of the barrier layer 112 and the cap 114. The passivation layer 120 is arranged over the gate protection layer 118, typically in direct contact with the gate protection layer 118, such that the bottom surface of the passivation layer 120 abuts a top surface of the gate protection layer 118. The passivation layer 120 is, for example, about 50 nanometers to 500 nanometers thick, and/or is or otherwise includes, for example, silicon nitride or silicon oxide. The gate protection layer 118 is, for example, about 5 Angstroms to 500 Angstroms thick, and/or is or otherwise includes, for example, aluminum nitride, aluminum oxide and/or a material resistive to ammonium hydroxide.

A first source/drain contact 122 and a second source/drain contact 124 are arranged on opposite sides of the gate structure 116 over the channel region 106. The first and second source/drain contacts 122, 124 extend vertically from over the passivation layer 120, through the passivation layer 120 and the gate protection layer 118, to the barrier layer 112. In some embodiments, the first and second source/drain contacts further extend into the barrier layer 112 and/or through the barrier layer 112 into the channel region 106. The first and second source/drain contacts 122, 124 are a conductive material, such as a metal. Examples of metals suitable for use with the first and second source/drain contacts 122, 124 include titanium, nickel, aluminum, gold, and ohmic metals. In some embodiments, the first and second source/drain contacts 122, 124 have a T-shaped profile, in which upper bottom surfaces of the first and second source/drain contacts 122, 124 directly abut a top surface of the passivation layer 120 and lower bottom surfaces of the source and drain regions directly abut a top surface of the barrier layer 112.

A capping layer 126 is arranged over top surfaces of the passivation layer 120, and the first and second source/drain contacts 122, 124. Further, the capping layer 126 is arranged along sidewalls of the first and second source/drain contacts 122, 124. In some embodiments, the capping layer directly abuts the first and second source/drain contacts 122, 124, and the passivation layer 120. The capping layer 126 is or otherwise includes, for example, silicon nitride or silicon oxide.

A gate 128 of the gate structure 116 is arranged over the cap 114. The gate 128 extends vertically from over the capping layer 126, through the capping layer 126 and the passivation layer 120, into or otherwise to gate protection layer 118. In some embodiments, the gate 128 and the cap 114 respectively abut opposing top and bottom surfaces of the gate protection layer 118. The thickness of the gate protection layer 118 between the gate 128 and the cap 114 is sufficient to protect the cap 114 from damage, such as etch damage or contamination, that could otherwise occur during processing, and as such helps to prevent leakage current in the final transistor. However, at the same time, the gate protection layer 118 is thin enough so that it doesn't inhibit the electrical coupling (e.g., ohmic coupling) of the gate 128 to the cap 114. Further, in some embodiments, the gate 128 has a T-shaped profile, in which an upper bottom surface of the gate 128 directly abuts a top surface of the gate protection layer 118, and a lower bottom surface of the gate 128 directly abuts a top surface of the gate protection layer 118. Alternatively, the gate 128 has a T-shaped profile, in which an upper bottom surface of the gate 128 directly abuts a top surface of the capping layer 126, and a lower bottom surface of the gate 128 directly abuts a top surface of the gate protection layer 118. The gate 128 is a conductive material, such as a metal. Examples of metals suitable for use with the gate 128 include titanium, nickel, aluminum, gold, and ohmic metals.

In some embodiments, in addition to lining top surfaces of the barrier layer 112 and top surfaces and sidewalls of the cap 114, the gate protection layer 118 lines sidewalls of the gate 128 and/or an lower surface of an overhang portion of the gate 128. For example, the capping layer 126 and the gate 128 can respectively abut opposing top and bottom surfaces of the gate protection layer 118.

Advantageously, the gate protection layer 118 protects the cap 114 during the formation of the gate 128 to allow it to be formed more controllably. As discussed above, the cap 114 can be employed to define the threshold voltage of the HEMT device, whereby imperfections affect the threshold voltage. Further, the gate protection layer 118 advantageously acts as a barrier to passivate the gate 128 and to reduce the sidewall trap level of the cap 114, which decreases leakage current in the final manufactured device. Collectively, the foregoing lead to improved threshold voltage uniformity and improved device reliability, as determined by, for example, HTGB and HTRB tests.

Figure 2:
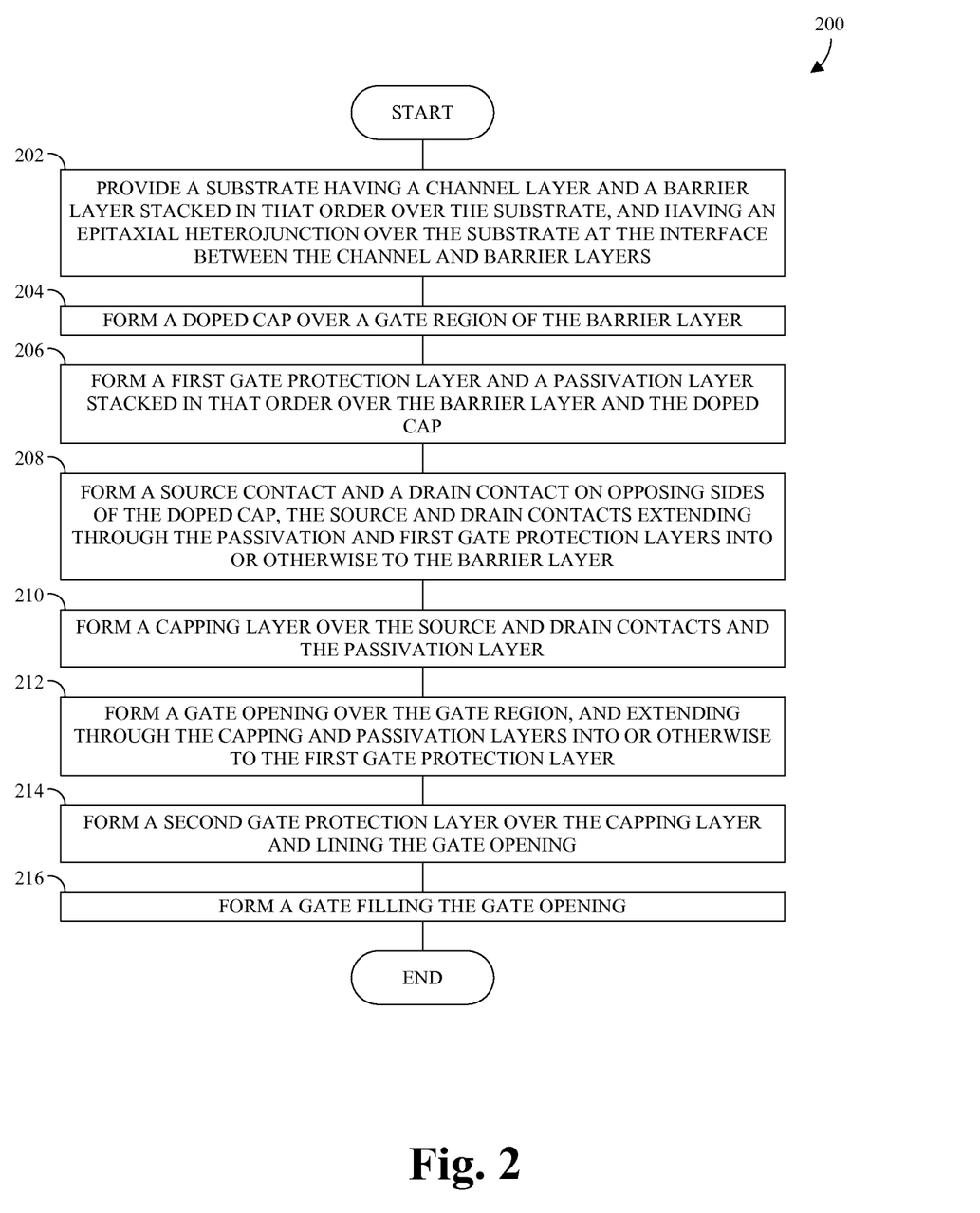
FIG. 2 illustrates a flow chart of some embodiments of a method for manufacturing a HEMT device employing a gate protection layer.

With reference to FIG. 2, a flowchart 200 provides some embodiments of a method for manufacturing a HEMT device, such as an enhancement mode transistor. An example of the resulting HEMT device is shown in FIG. 1.

At Action 202, a substrate having a channel layer and a barrier layer stacked in that order over the substrate, and having an epitaxial heterojunction over the substrate at an interface between the channel and barrier layers, is provided.

At Action 204, a cap is formed over a gate region of the barrier layer.

At Action 206, a first gate protection layer and a passivation layer are formed stacked in that order over the barrier layer and the cap.

At Action 208, a source contact and a drain contact are formed on opposing sides of the cap. The source and drain contacts extend through the passivation and first gate protection layers into or otherwise to the barrier layer.

At Action 210, a capping layer is formed over the source and drain contacts and the passivation layer.

At Action 212, a gate opening is formed over the gate region, and extending through the capping and passivation layers into or otherwise through the first gate protection layer, but not into the cap.

At Action 214, a second gate protection layer is formed over the capping layer and lining the gate opening. In alternative embodiments, the second gate protection layer is omitted or otherwise limited to a bottom of the gate opening.

At Action 216, a gate is formed filling the gate opening.

Advantageously, the first gate protection layer protects the cap during the formation of the gate to allow it to be formed more controllably. When the gate opening is formed, the opening extends into or otherwise to the first gate protection layer, as opposed to into the cap. Further, the first and second gate protection layers advantageously acts as a barrier to passivate the gate and to reduce the sidewall trap level of the cap. Collectively, the foregoing lead to reduced leakage current, improved threshold voltage uniformity, and improved device reliability.

While the disclosed methods (e.g., the method described by the flowchart 200) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-10, cross-sectional views of some embodiments of the HEMT device of FIG. 1 at various stages of manufacture are provided to illustrate the method of FIG. 2. Although FIGS. 3-10 are described in relation to the method, it will be appreciated that the structures disclosed in FIGS. 3-10 are not limited to the method, but instead may stand alone as structures independent of the method. Similarly, although the method is described in relation to FIGS. 3-10, it will be appreciated that the method is not limited to the structures disclosed in FIGS. 3-10, but instead may stand alone independent of the structures disclosed in FIGS. 3-10.

Figure 3:
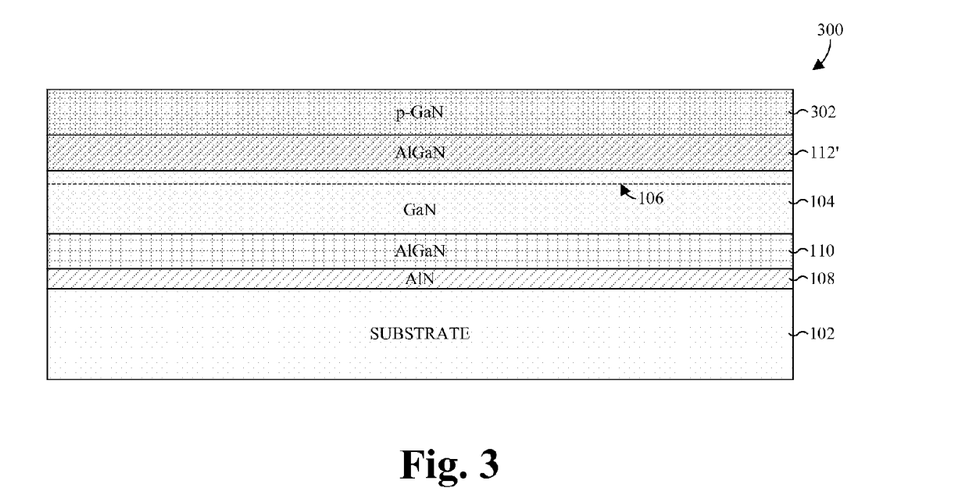
FIGS. 3-10 illustrate a series of cross-sectional views of some embodiments of a HEMT device employing a gate protection layer.

FIG. 3 illustrates a cross-sectional view 300 of some embodiments corresponding to Action 202.

As shown by FIG. 3, a channel layer 104 and a barrier layer 112' are formed stacked in that order over a substrate 102. The substrate 102 is, for example, a wafer and/or is, for example, a silicon carbide substrate, a silicon substrate, or a sapphire substrate. The barrier layer 112' includes a material having a band gap unequal to (e.g., larger than) that of the channel layer 104. For example, the channel layer 104 is or otherwise includes GaN, and the barrier layer 112' is or otherwise includes AlGaN layer. In some embodiments, the channel layer 104 is epitaxially grown over the substrate 102, and the barrier layer 112' is epitaxially grown over the channel layer 104. The channel and the barrier layers 104, 112' define a heterojunction at an interface therebetween. The heterojunction results in a 2-dimensional electron gas (2-DEG) forming at the interface in a channel region 106 of the channel layer 104. In operation, the 2-DEG serves as a conductive channel.

In some embodiments, before forming the channel layer 104 and the barrier layer 112', one or more buffer layers 108, 110 are formed over the substrate 102. For example, a first buffer layer 108 of AlN is arranged on the substrate 102, and a second buffer layer 110 of AlGaN is arranged on the first buffer layer 108. The buffer layers 108, 110 have lattice constants that transition between a lattice constant of the substrate 102 and a lattice constant of the channel layer 104.

Figure 4:
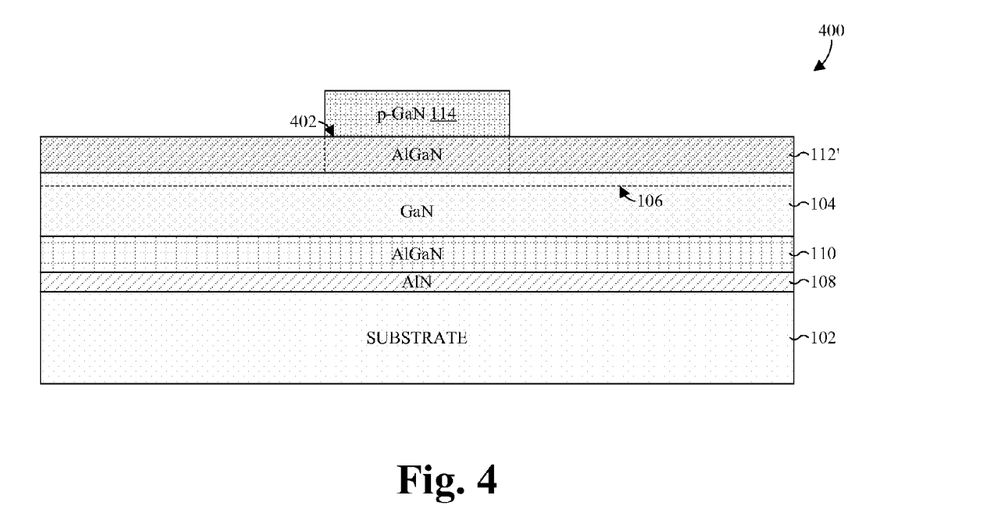

FIGS. 3 and 4 illustrate cross-sectional views 300, 400 of some embodiments corresponding to Action 204.

As shown by FIG. 3, a cap layer 302 is formed over the barrier layer 112'. The cap layer 302 includes a group III-V semiconductor material with a high work function. In some embodiments, the group III-V semiconductor material includes GaN having a doping type. In alternative embodiments, the group III-V semiconductor material includes AlGaN or InGaN having the doping type. The doping type is, for example, a p-type doping, an n-type doping, or both a p-type and n-type doping.

As shown by FIG. 4, a first etch is performed to the barrier layer 112' through regions of the cap layer 302 surrounding a gate region 402 (demarcated by dashed lines) of the barrier layer 112'. The gate region 402 corresponds to a region of the barrier layer 112' over which a gate structure is formed. The first etch forms a cap 114 of the gate structure over the gate region 402. The cap 114 is typically employed to set the threshold voltage of the HEMT device. For example, dimensions and material properties of the cap 114 can be controlled to set the threshold voltage. In some embodiments, the process for the first etch includes forming a first photoresist layer over the cap layer 302, patterning the first photoresist layer, applying an etchant to the patterned first photoresist layer and the cap layer 302, and removing the patterned first photoresist layer.

Figure 5:
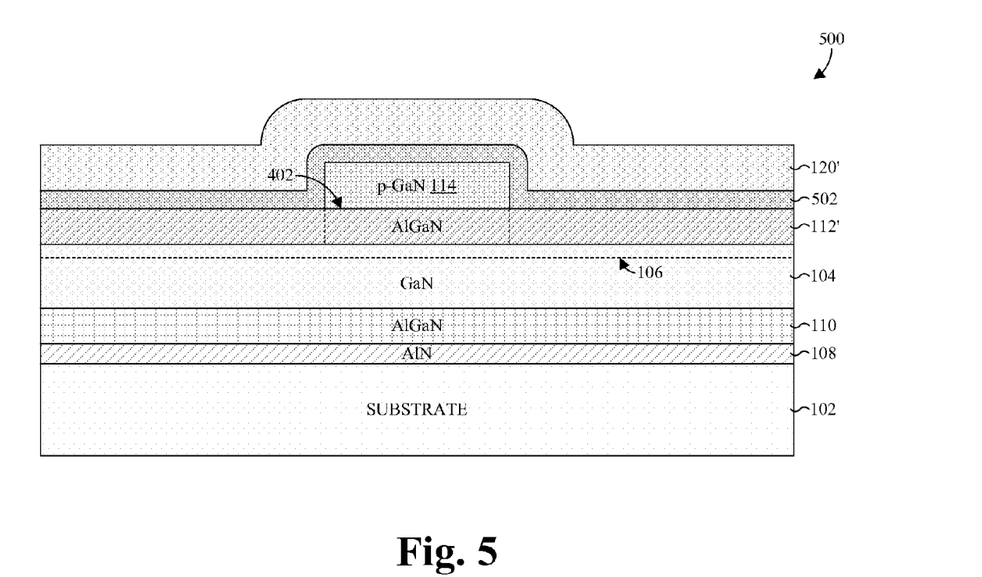

FIG. 5 illustrates a cross-sectional view 500 of some embodiments corresponding to Action 206.

As shown by FIG. 5, a first gate protection layer 502 is formed over the barrier layer 112' and the cap 114. The first gate protection layer 502 lines sidewalls and a top surface of the cap 114 to protect the cap 114 during actions performed hereafter. In some embodiments, the first gate protection layer 502 is about 5 Angstroms to 500 Angstroms thick. Further, in some embodiments, the first gate protection layer 502 is one of aluminum nitride, aluminum oxide or another material resistive to ammonium hydroxide. The first gate protection layer 502 is typically formed conformally, and is typically formed by one or more of physical vapor deposition (PVD), chemical vapor deposition (CVD), and atomic layer deposition (ALD).

The first gate protection layer 502 advantageously reduces the sidewall trap level of the cap 114, thereby reducing conductivity along the sidewalls of the cap 114. This, in turn, eliminates a current leakage path along the sidewalls of the cap 114, or otherwise reduces the leakage current along this path. Further, by reducing the leakage current, the threshold voltage uniformity and device reliability are improved.

Also shown by FIG. 5, a passivation layer 120' is formed over the first gate protection layer 502. The passivation layer 120' protects the first gate protection layer 502 during actions performed hereafter. In some embodiments the passivation layer 120' is about 50 nanometers to about 500 nanometers thick. The passivation layer 120' is typically formed conformally, and is typically formed by one of CVD, PVD, and plasma-enhanced CVD (PECVD).

Figure 6:
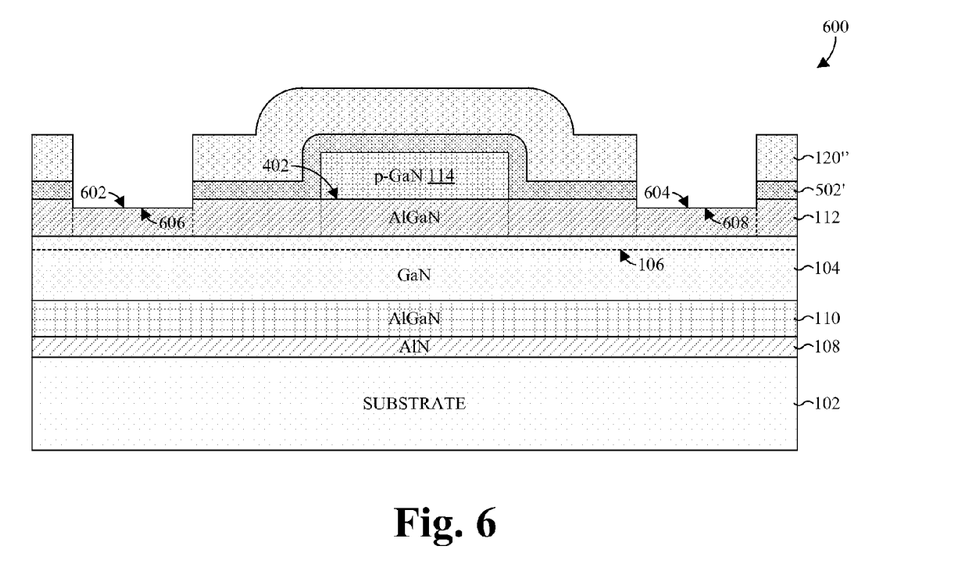
Figure 7:
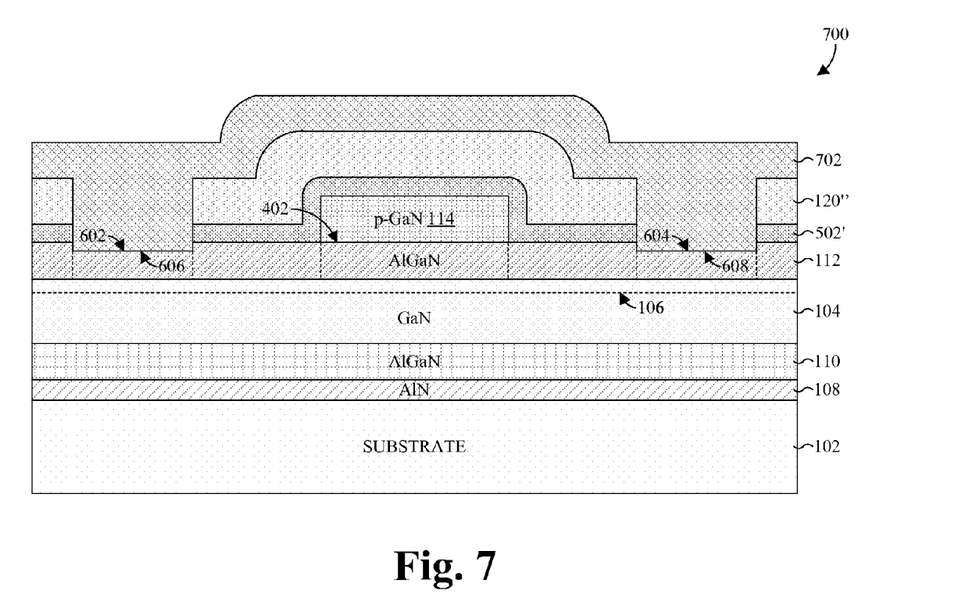
Figure 8:
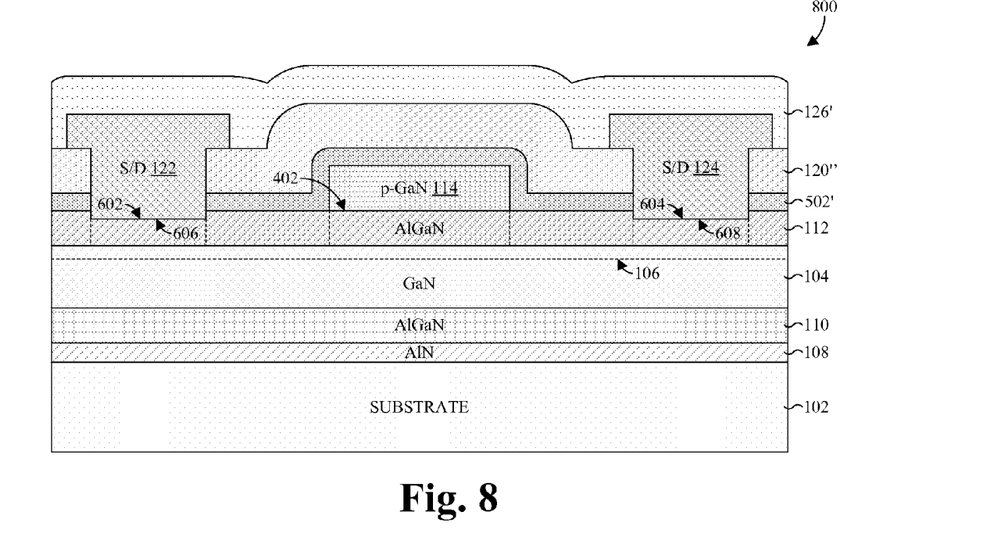

FIGS. 6-8 illustrate cross-sectional views 600, 700, 800 of some embodiments corresponding to Action 208.

As shown by FIG. 6, a second etch is performed to the barrier layer 112' through regions of the passivation layer 120' and the first gate protection layer 502 over a first source/drain region 602 (demarcated by dashed lines) and a second source/drain region 604 (demarcated by dashed lines), of the barrier layer 112'. In some embodiments, the second etch is also performed into the barrier layer 112' and/or, into the channel region 106. The first and second source/drain regions 602, 604 correspond to regions of the barrier layer 112' over which source/drain contacts are formed. The first and second source/drain regions 602, 604 are arranged on opposite sides of the gate region 402, such that the second etch forms first and second source/drain contact openings 606, 608 on opposite sides of the cap 114. In some embodiments, the process for the second etch includes forming a second photoresist layer over the passivation layer 120', patterning the second photoresist layer, applying an etchant to the patterned second photoresist layer and the passivation layer 120', and removing the patterned second photoresist layer.

As shown by FIG. 7, a first contact layer 702 is formed over the remaining passivation layer 120" and filling the first and second source/drain contact openings 606, 608. The first contact layer 702 is or otherwise includes a conductive material, such as a metal. Examples of suitable metals include titanium, nickel, aluminum, and gold. In some embodiments, the first contact layer 702 is an ohmic metal.

As shown by FIG. 8, a third etch is performed to the remaining passivation layer 120" through peripheral regions of the first contact layer 702 surrounding the first and second source/drain contact openings 606, 608. In some embodiments, there is a margin between the peripheral regions and the first and second source/drain contact openings 606, 608. The third etch results a first source/drain contact 122 and a second source/drain contract 124 arranged in the first and second source/drain contact openings 606, 608. In some embodiments, the process for the third etch includes forming a third photoresist layer over the remaining passivation layer 120", patterning the third photoresist layer, applying an etchant to the patterned third photoresist layer and the remaining passivation layer 120", and removing the patterned third photoresist layer.

FIG. 8 illustrates a cross-sectional view 800 of some embodiments corresponding to Action 210.

As shown by FIG. 8, a capping layer 126' is formed over the first and second source/drain contacts 122, 124 and over the remaining passivation layer 120". The capping layer 126' is or otherwise includes, for example, silicon nitride or silicon oxide.

Figure 9:
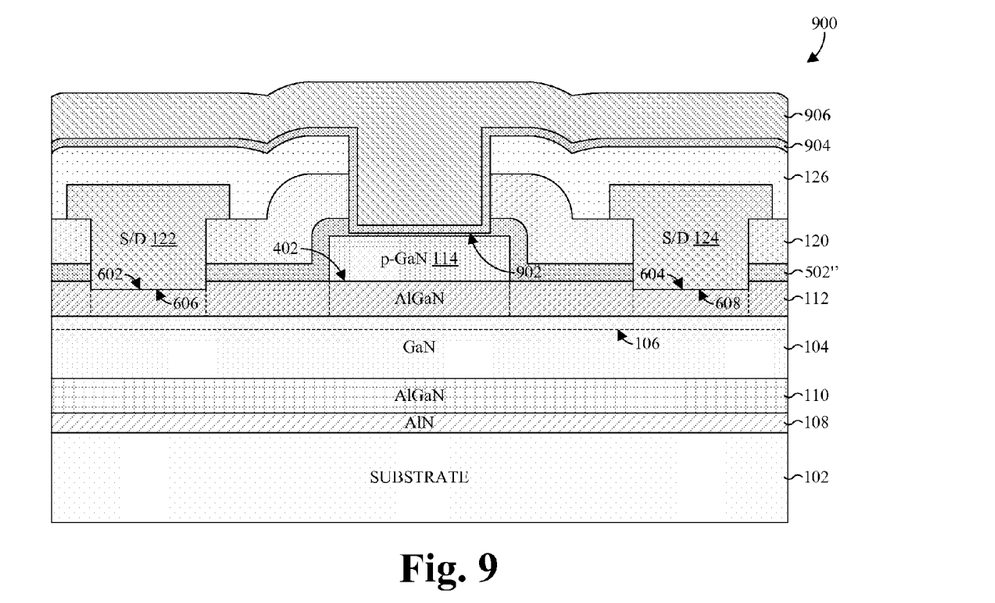

FIG. 9 illustrates a cross-sectional view 900 of some embodiments corresponding to Action 212.

As shown by FIG. 9, a fourth etch is performed to the remaining first gate protection layer 502' through the capping layer 126' and the remaining passivation layer 120" over the gate region 402 of the remaining barrier layer 112. In some embodiments, the fourth etch further extends into or through the remaining first gate protection layer 502', but not into the remaining barrier layer 112. The fourth etch forms a gate opening 902 over the gate region 402 of the remaining barrier layer 112, and electrically isolated from the cap 114 by the remaining first gate protection layer 502'. The fourth etch is typically performed by a dry etch, but other types of etches are amenable. For example, a wet etch with a solution of ammonium hydroxide can be employed. In some embodiments, the process for the fourth etch includes forming a fourth photoresist layer over the capping layer 126', patterning the fourth photoresist layer, applying an etchant to the patterned fourth photoresist layer and the capping layer 126', and removing the patterned fourth photoresist layer.

The remaining first gate protection layer 502' advantageously protects the cap 114 during the formation of the gate opening 902, which prevents damage to the cap 114 and better controls the shape of the cap 114. Since the cap 114 affects the threshold voltage of the HEMT device, a more uniform threshold voltage is achieved as a result of the remaining first gate protection layer 502'. Further, by preventing damage to the cap 114, device reliability is also improved.

FIG. 9 illustrates a cross-sectional view 900 of some embodiments corresponding to Action 214.

As shown by FIG. 9, a second gate protection layer 904 is formed over the remaining capping layer 126 and lining the gate opening 902. In some embodiments, the second gate protection layer 904 is omitted or otherwise limited to a bottom of the gate opening 902. The second gate protection layer 904 is typically about 5 Angstroms to 500 Angstroms thick. Further, the second gate protection layer 904 is typically formed conformally, and is typically formed by one or more of PVD, CVD, and ALD. In some embodiments, the second gate protection layer 904 is one of aluminum nitride, aluminum oxide or another material resistive to ammonium hydroxide.

Figure 10:
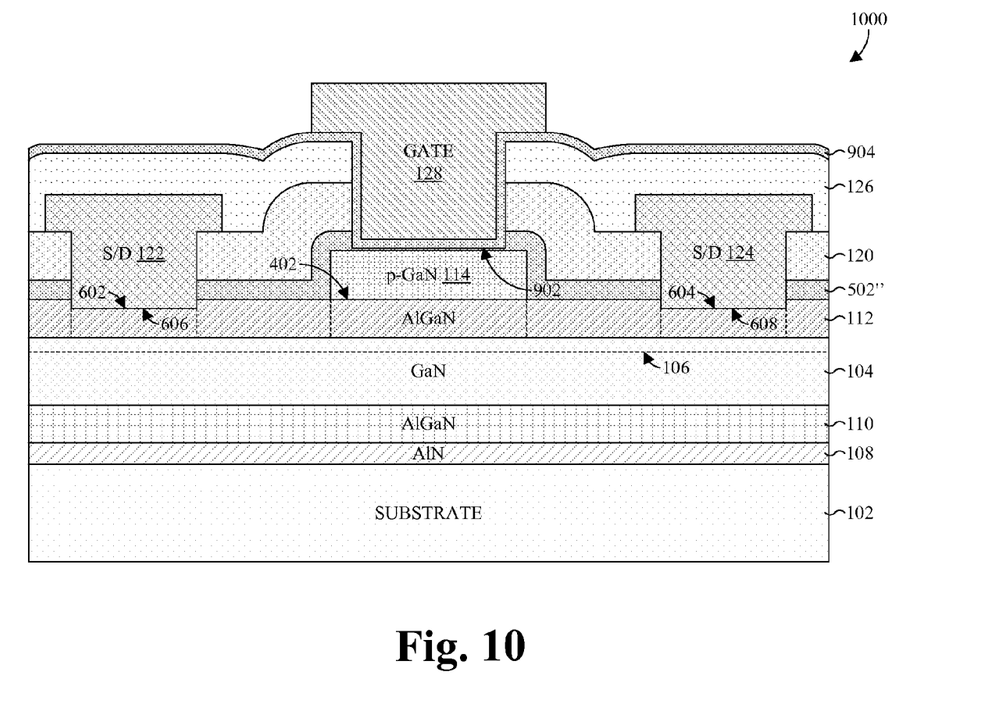

FIGS. 9 and 10 illustrate cross-sectional views 900, 1000 of some embodiments corresponding to Action 216.

As shown by FIG. 9, a second contact layer 906 is formed over the second gate protection layer 904 and filling the gate opening 902. The second contact layer 906 is or otherwise includes a conductive material, such as a metal. Examples of suitable metals include titanium, nickel, aluminum, gold. In some embodiments, the second contact layer 906 is an ohmic metal.

As shown by FIG. 10, a fifth etch is performed to the second gate protection layer 904 through peripheral regions of the second contact layer 906 surrounding the gate opening 902. In some embodiments, there is a margin between the peripheral regions and the gate opening 902. The fifth etch results a gate 128 arranged in the gate opening 902. In some embodiments, the process for the fifth etch includes forming a fifth photoresist layer over the second contact layer 906, patterning the fifth photoresist layer, applying an etchant to the patterned fifth photoresist layer and the second contact layer 906, and removing the patterned fifth photoresist layer.

The remaining first gate protection layer 502" and the second gate protection layer 904 advantageously line the sidewalls and bottom surfaces of the gate 128. This passivates the gate 128, as well as prevents or otherwise reduces the leakage of current from the gate 128 to the channel region 106 through the cap 114 and/or along sidewalls of the cap 114. By reducing leakage current, the uniformity of the threshold voltage is improved and the device reliability is improved. Further, the combined thickness of the remaining first gate protection layer 502" and the second gate protection layer 904 between the cap 114 and the gate 128 is such that it doesn't inhibit conductance between the gate 128 and the cap 114 during biasing of the HEMT device.

Thus, as can be appreciated from above, the present disclosure provides a HEMT device. A substrate has a channel layer arranged over the substrate and has a barrier layer arranged over the channel layer. The channel and barrier layers define a heterojunction, and a gate structure is arranged over a gate region of the barrier layer. The gate structure includes a gate arranged over a cap, where the cap is disposed on the barrier layer. A gate protection layer is arranged along sidewalls of the cap and arranged below the gate between opposing surfaces of the gate and the cap.

In other embodiments, the present disclosure provides a method for manufacturing a HEMT device. A substrate is provided having a channel layer arranged over the substrate and having a barrier layer arranged over the channel layer. The channel and barrier layers define a heterojunction. A cap is formed over the barrier layer, a gate protection layer is formed over, and along sidewalls of, the cap, and a gate is formed over the cap and the gate protection layer. The gate extends into the gate protection layer, but not into the cap.

In yet other embodiments, the present disclosure provides a GaN enhancement mode transistor. A substrate has a GaN layer arranged over the substrate and has an AlGaN layer arranged over the GaN layer. The GaN and AlGaN layers define a heterojunction. A gate structure is arranged over a gate region of the AlGaN layer. The gate structure includes a metal gate arranged over a doped GaN cap. An aluminum nitride or aluminum oxide gate protection layer is arranged along sidewalls of the doped GaN cap and arranged below the metal gate between opposing surfaces of the metal gate and the doped GaN cap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high-electron mobility transistor (HEMT) device comprising:
   a substrate having a channel layer arranged over the substrate and having a barrier layer arranged over the channel layer, wherein the channel and barrier layers define a heterojunction;
   a gate structure arranged over a gate region of the barrier layer, the gate structure including a gate arranged over a cap, wherein the cap is disposed on the barrier layer and comprises a planar upper surface, wherein the planar upper surface extends laterally between opposing sidewalls of the cap that underlie the planar upper surface, and wherein the gate protrudes towards the cap to culminate at a lower surface overlying the planar upper surface; and
   a gate protection layer arranged along the sidewalls of the cap, and arranged below the gate, wherein the gate protection layer continuously covers the planar upper surface to separate the planar upper surface of the cap and the lower surface of the gate.

2. The HEMT according to claim 1, wherein the gate protection layer is further arranged along sidewalls of the gate.

3. The HEMT according to claim 1, wherein the gate protection layer includes aluminum nitride or aluminum oxide.

4. The HEMT according to claim 1, wherein the cap includes doped gallium nitride.

5. The HEMT according to claim 1, further including:
   a passivation layer arranged over the gate protection layer, wherein the gate extends orthogonal to the planar upper surface, through the passivation layer, to the lower surface of the gate, wherein the lower surface of the gate underlies a lower surface of the passivation layer.

6. The HEMT according to claim 1, further including:
   a first source/drain contact and a second source/drain contact arranged on opposing sides of the gate structure, wherein the first and second source/drain contacts extend orthogonal to the planar upper surface to or otherwise into the barrier layer; and
   a capping layer covering the first and second source/drain contacts and the gate protection layer, wherein the gate protection layer extends partially over the capping layer, and wherein the gate extends orthogonal to the planar upper surface, through the capping layer, to the lower surface.

7. The HEMT according to claim 1, wherein the lower surface is planar and directly contacts the gate protection layer, and wherein the gate protection layer extends continuously from a first side of the lower surface to a second side of the lower surface that opposes the first side.

8. The HEMT according to claim 1, wherein the HEMT further comprises a pair of source/drain contacts respectively arranged on opposite sides of the gate, wherein an entire profile of the cap is rectangular, and wherein a bottom surface of the cap overlies a top surface of the barrier layer.

9. The HEMT according to claim 8, where the gate protection layer and the cap contact the top surface of the barrier layer.

10. The HEMT according to claim 1, wherein a region of the gate protection layer arranged over the planar upper surface of the cap includes a recessed surface that is recessed below a top surface of the region and that contacts the lower surface of the gate, and wherein the recessed surface is laterally spaced from ends of the of the region.

11. A method for manufacturing a high-electron mobility transistor (HEMT) device, said method comprising:
   providing a substrate having a channel layer arranged over the substrate and having a barrier layer arranged over the channel layer, wherein the channel and barrier layers define a heterojunction;
   forming a cap over the barrier layer and comprising a planar upper surface that extends laterally between opposing sidewalls of the cap;
   forming a gate protection layer over, and along the sidewalls of, the cap;
   forming a gate opening over the cap and the gate protection layer, the gate opening extending into the gate protection layer, but not into the cap;
   forming a second gate protection layer lining sidewalls of the gate opening;
   forming source/drain contacts on opposing sides of the cap;
   forming a capping layer covering the gate protection layer and the source/drain contacts; and
   forming a gate over the cap and the gate protection layer, and further in the gate opening between the lined sidewalls of the gate opening, wherein the gate extends from over the capping layer, through the capping layer, and culminates at a lower surface overlying the planar upper surface.

12. The method according to claim 11, further including:
forming the gate protection layer from aluminum nitride or aluminum oxide.

13. The method according to claim 11, further including:
forming the gate protection layer with a thickness of about 5 to about 500 Angstroms.

14. The method according to claim 11, further including:
forming the channel layer with gallium nitride.

15. The method according to claim 11, further including:
forming the cap with doped gallium nitride.

16. The method according to claim 11, further including:
forming a passivation layer over the gate protection layer; and
forming the gate extending orthogonal to the planar upper surface, through the passivation layer, to the lower surface.

17. The method according to claim 11, wherein forming the source/drain contacts comprises forming a first source/drain contact and a second source/drain contact arranged on opposing sides of the cap, wherein the first and second source/drain contacts extend orthogonal to the planar upper surface to or otherwise into the barrier layer, and wherein the method further comprises:
   forming the capping layer covering the first and second source/drain contacts and the gate protection layer; and
   forming the gate extending orthogonal to the planar upper surface, through the capping layer, to the lower surface.

18. A gallium nitride (GaN) enhancement mode transistor comprising:
   a substrate having a GaN layer arranged over the substrate and having an aluminum gallium nitride (AlGaN) layer arranged over the GaN layer, wherein the GaN and AlGaN layers define a heterojunction;
   a gate structure arranged over a gate region of the AlGaN layer, the gate structure including a metal gate arranged over a doped GaN cap, wherein the metal gate comprises a bottommost point arranged over a topmost point of the doped GaN cap, wherein the bottommost point of the metal gate is bottommost for a whole of the metal gate, and wherein the topmost point of the doped GaN cap is topmost for a whole of the doped GaN cap; and
   an aluminum nitride or aluminum oxide gate protection layer arranged along sidewalls of the doped GaN cap and continuously along a top surface of the doped GaN cap to space the topmost point from the bottommost point.

19. The GaN enhancement mode transistor according to claim 18, further comprising:
   a passivation layer covering the aluminum nitride or aluminum oxide gate protection layer;
   a pair of source/drain contacts that are laterally spaced on opposing sides of the gate structure and that extend through the passivation layer from over the passivation layer; and
   a capping layer covering the source/drain contacts and the passivation layer, wherein the metal gate extends from over the capping layer, through the capping and passivation layers, to culminate at a lower surface that includes the bottommost point.

20. The GaN enhancement mode transistor according to claim 18, wherein the top surface of the doped GaN cap is planar and arranged at the topmost point, wherein the metal gate comprises a planar bottom surface arranged at the bottommost point, and wherein the aluminum nitride or aluminum oxide gate protection layer directly contacts the top surface and the planar bottom surface.

* * * * *